(12) United States Patent
Mimino

(10) Patent No.: US 9,966,919 B2
(45) Date of Patent: May 8, 2018

(54) GAIN CONTROL CIRCUIT AND GAIN CONTROL METHOD

(71) Applicant: LAPIS Semiconductor Co., Ltd., Yokohama (JP)

(72) Inventor: Yutaka Mimino, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days. days.

(21) Appl. No.: 15/364,375

(22) Filed: Nov. 30, 2016

(65) Prior Publication Data

US 2017/0163232 A1 Jun. 8, 2017

(30) Foreign Application Priority Data

Dec. 3, 2015 (JP) ................................. 2015-236209

(51) Int. Cl.
*H03G 3/20* (2006.01)
*H03G 3/30* (2006.01)
*H03F 3/19* (2006.01)
*H04B 1/10* (2006.01)

(52) U.S. Cl.
CPC ............. *H03G 3/3042* (2013.01); *H03F 3/19* (2013.01); *H04B 1/10* (2013.01); *H03F 2200/102* (2013.01); *H03F 2200/451* (2013.01)

(58) Field of Classification Search
CPC ............... H03G 3/3036; H03G 3/3042; H03G 2201/106
USPC .................................................. 330/144, 284
See application file for complete search history.

(56) References Cited

U.S. PATENT DOCUMENTS

2011/0279179 A1* 11/2011 Vice ..................... H03G 3/007
330/127
2012/0142297 A1* 6/2012 Oba ..................... H03G 3/3068
455/231

FOREIGN PATENT DOCUMENTS

JP 2011-199599 A 10/2011

* cited by examiner

*Primary Examiner* — Steven J Mottola
(74) *Attorney, Agent, or Firm* — Rabin & Berdo, P.C.

(57) ABSTRACT

A gain control circuit, having an attenuator including first to n-th (n>2) attenuator parts that attenuate an input signal respectively in accordance with first to n-th attenuation control signals to thereby generate an attenuated input signal, a signal amplifier configured to amplify the attenuated input signal, a detector circuit configured to conduct an envelope detection on the amplified attenuated input signal to thereby obtain an amplitude value, a comparator circuit configured to compare the amplitude value with a reference threshold value to thereby generate a comparison result signal, and an attenuator control circuit configured to generate the first to n-th attenuation control signals using the comparison result signal. The attenuation control signals indicate first to n-th attenuation amounts by which the first to n-th attenuator parts respectively attenuate the input signal, and first to n-th time periods during which the first to n-th attenuator parts respectively operate.

8 Claims, 14 Drawing Sheets

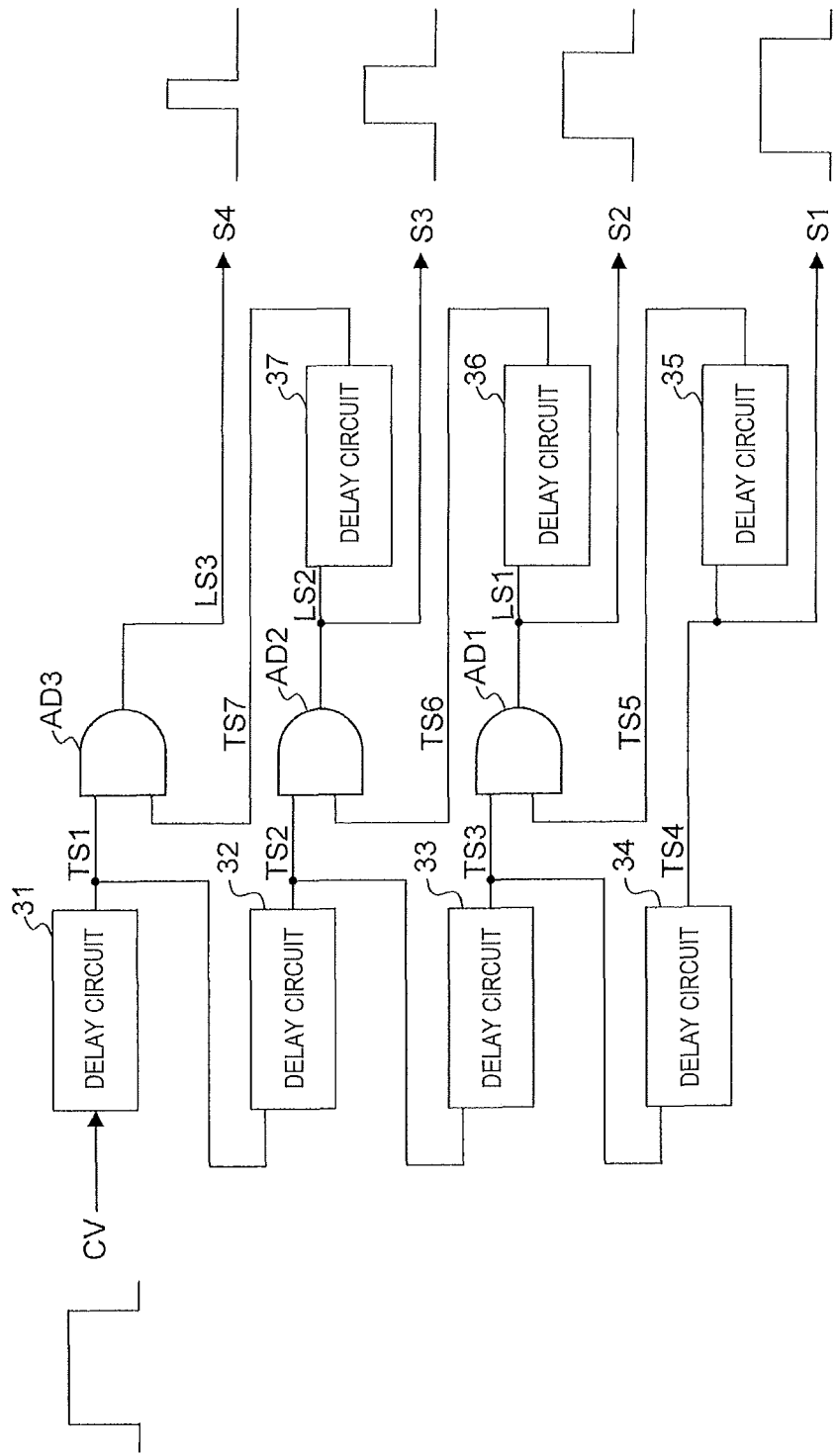

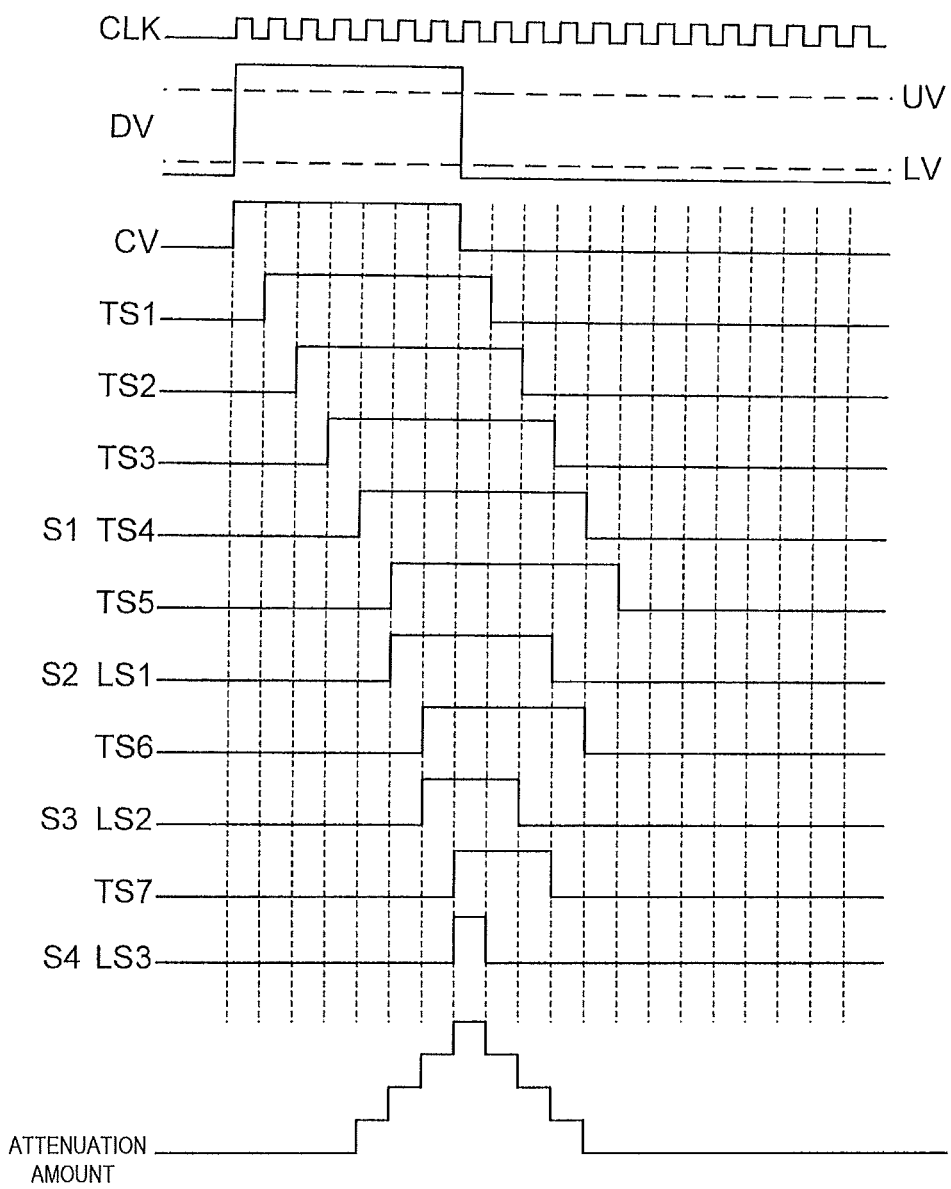

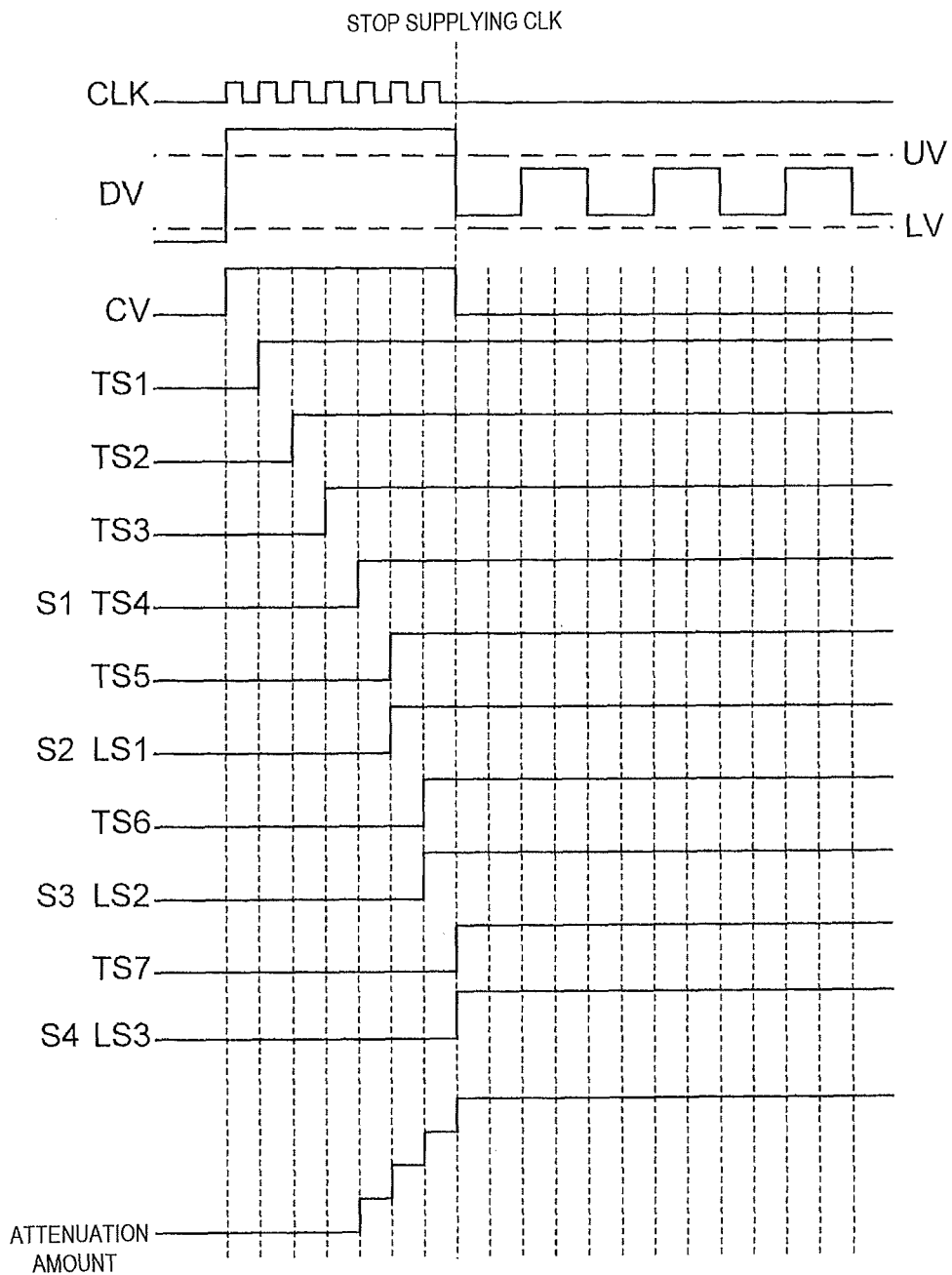

GAIN CONTROL CIRCUIT AND GAIN CONTROL METHOD

TECHNICAL FIELD

The present invention relates to a gain control circuit and gain control method.

BACKGROUND ARTS

In wireless communications, the intensity of radio signals keeps fluctuating due to a change in transmission status of the radio waves between a transmitter and a receiver. Thus, in the receiver, the SN ratio (signal-noise ratio) or distortion rate fluctuates depending on the intensity of received radio signals. In order to solve this problem, a receiver is equipped with a gain control circuit that automatically conducts gain control. The gain control circuit is configured to amplify a signal to improve the SN ratio when the intensity of a received signal is low, and attenuate a signal to mitigate the distortion of the signal, which occurs in the receiver, when the intensity of a received signal is high. In some cases, the intensity of the received signal greatly changes within a range up to 100 dB, for example, and therefore, the receiver is required to have a gain control range of approximately 100 dB. Because it is not possible to predict the timing of the signal intensity change, the gain control circuit needs to operate in real-time when a change in signal intensity occurs. For this reason, there is a demand for a high-performance gain control circuit that has both the wide gain control range and real-time operation capability.

A gain control circuit using an analog circuit has an advantage of high operation speed, and therefore, it is possible to provide excellent performance in the real-time operation. However, a gain control circuit with an analog circuit has several drawbacks such as noise overlapping the main signal or a difficulty to achieve a wide gain control range because the gain changing circuit itself is susceptible to distortion when the reception intensity is high. To solve those problems, a receiver having an automatic gain control circuit that uses a step attenuator configured to change the gain of the amplifier in a step-like manner is proposed (Japanese Patent Application Laid-open Publication No. 2011-199599, for example).

SUMMARY OF THE INVENTION

The gain control circuit using a step attenuator can change the gain more dynamically than the gain control circuit using an analog circuit. However, this circuit has a problem of noise when a change in input signal occurs rapidly and the change amount is great, which causes the level of change between respective steps to be greater when switching the gain.

Possible solutions to suppress the noise include increasing or decreasing the attenuation amount in accordance with a change in input signal during the gain control process, but this requires a high-speed AD converter and the like, and therefore, the circuit would be more complex and larger in size.

In order to solve the above-mentioned problems, the present invention aims at providing a gain control circuit and gain control method that can mitigate the generation of noise with a simple configuration.

A gain control circuit for performing gain control on an input signal, according to an aspect of the invention includes an attenuator including first to n-th attenuator parts that are configured to attenuate the input signal respectively in accordance with first to n-th attenuation control signals, to thereby generate an attenuated input signal, n being an integer larger than 2, a signal amplifier configured to amplify the attenuated input signal, a detector circuit configured to conduct an envelope detection on the amplified attenuated input signal, to thereby obtain an amplitude value, a comparator circuit configured to compare the amplitude value with a reference threshold value, to thereby generate a comparison result signal indicating a result of the comparison, and an attenuator control circuit configured to generate the first to n-th attenuation control signals using the comparison result signal, and to supply the first to n-th attenuation control signals to the attenuator, wherein the first to n-th attenuation control signals indicate first to n-th attenuation amounts by which the first to n-th attenuator parts respectively attenuate the input signal, and first to n-th time periods during which the first to n-th attenuator parts respectively operate.

A gain control method for performing gain control on an input signal, according to an aspect of the invention includes performing, by an attenuator, first to n-th attenuation on the input signal in accordance with first to n-th attenuation control signals, to thereby generate an attenuated input signal, n being an integer larger than 2, amplifying, by a signal amplifier, the attenuated input signal, conducting, by a detector circuit, an envelope detection on the amplified attenuated input signal, to thereby obtain an amplitude value, comparing, by a comparator circuit, the amplitude value with a reference threshold value, to thereby generate a comparison result signal indicating a result of the comparison, and generating, by an attenuator control circuit, the first to n-th attenuation control signals using the comparison result signal, and supplying the first to n-th attenuation control signals to the attenuator, wherein the first to n-th attenuation control signals indicate first to n-th attenuation amounts by which the first to n-th attenuator parts respectively attenuate the input signal, and first to n-th time periods during which the first to n-th attenuator parts respectively operate.

According to the present invention, it is possible to provide a gain control circuit and gain control method that can mitigate the generation of noise with a simple configuration.

BRIEF DESCRIPTION OF THE DRAWINGS

FIG. 4 is a block diagram showing the configuration of an attenuator control circuit.

FIG. 12 is a time chart showing an example of each signal when a clock signal is supplied.

FIG. 13 is a time chart showing an example of each signal when a clock signal is stopped.

DETAILED DESCRIPTION OF THE INVENTION

Embodiments of the present invention will be explained below with reference to figures.

Embodiment 1

Figure 1:
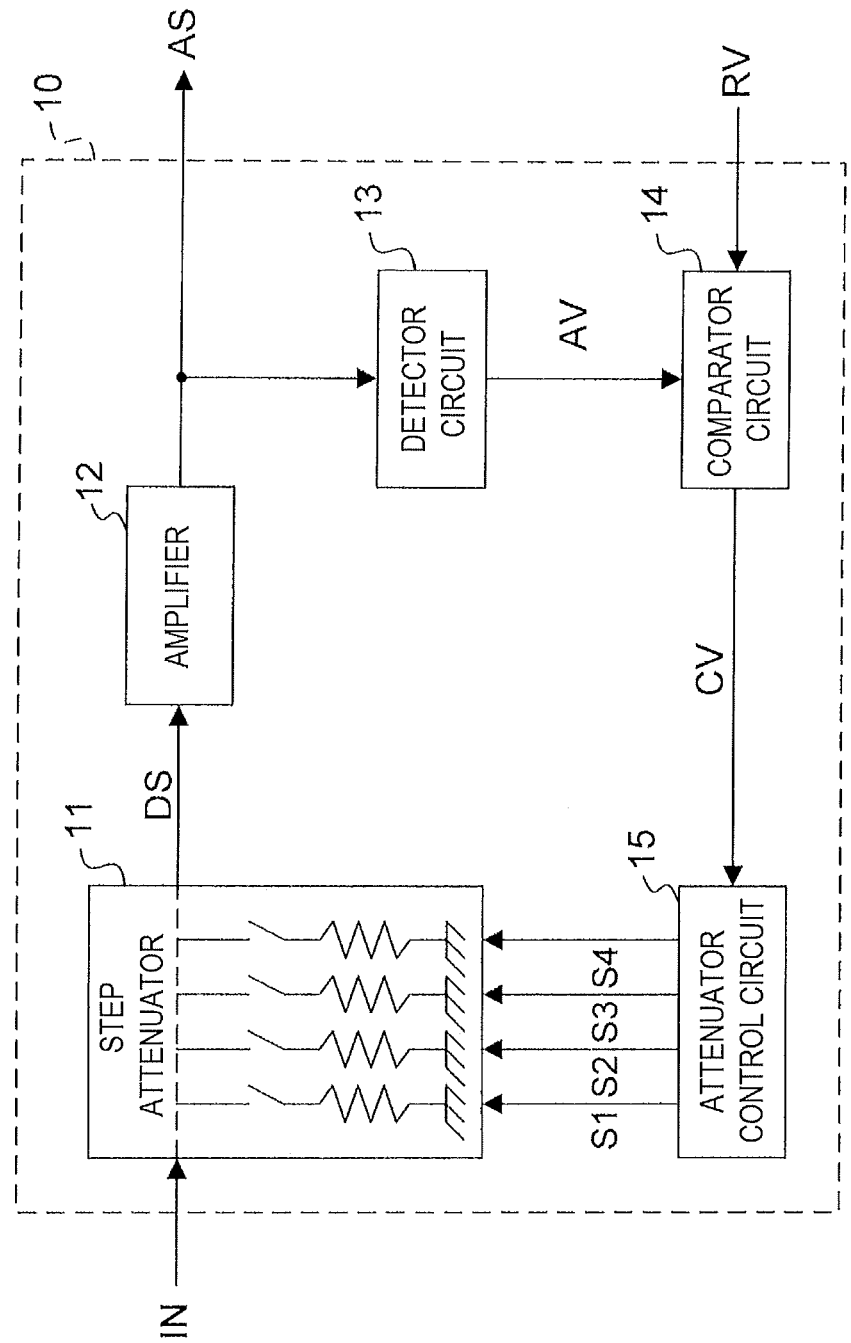
FIG. 1 is a block diagram showing the configuration of a gain control circuit of the present invention.

FIG. 1 is a block diagram showing the configuration of a gain control circuit 10 in this embodiment. The gain control circuit 10 is formed in a semiconductor IC. The gain control circuit 10 is configured to receive high-frequency signals used for VICS (registered trademark) (Vehicle Information and Communication System), for example, and attenuate or amplify the signal intensity. The gain control circuit 10 includes a step attenuator 11, an amplifier 12, a detector circuit 13, a comparator circuit 14, and an attenuator control circuit 15.

The step attenuator 11 is a variable attenuator that conducts an attenuation process on an input signal IN by receiving attenuation control signals (first attenuation control signal S1, second attenuation control signal S2, third attenuation control signal S3, and fourth attenuation control signal S4) from the attenuator control circuit 15, and changing the attenuation amount.

Figure 2:
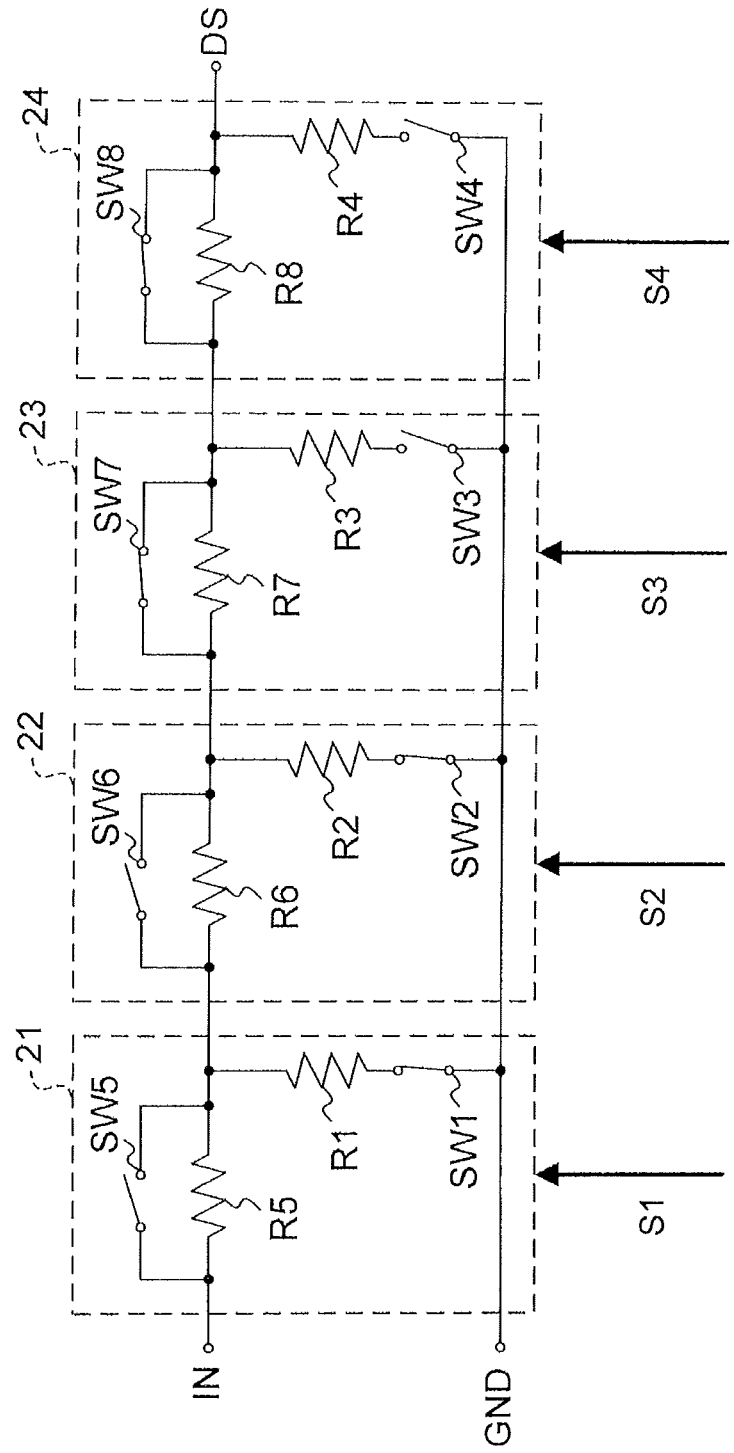
FIG. 2 is a circuit diagram showing the configuration of a step attenuator.

FIG. 2 is a circuit diagram showing the configuration of the step attenuator 11. The step attenuator 11 includes a first attenuator part 21, a second attenuator part 22, a third attenuator part 23, and a fourth attenuator part 24.

The first attenuator part 21 includes resistors (resistances) R1 and R5, a switch SW1 connected to the resistor R1 in series, and a switch SW5 connected to the resistor R5 in parallel. The switch SW1 and the switch SW5 operate in a complementary manner in accordance with the signal value (high level or low level) of the first attenuation control signal S1 supplied from the attenuator control circuit 15. Specifically, when the first attenuation control signal S1 is a high-level signal, the switch SW1 is turned on, and the switch SW5 is turned off. When the first attenuation control signal S1 is a low-level signal, the switch SW1 is turned off, and the switch SW5 is turned on. When the high-level first attenuation control signal S1 is supplied (or in other words, when the switch SW1 is on and the switch SW5 is off), the first attenuator part 21 attenuates the input signal IN, and supplies the attenuated signal to the second attenuator part 22. When the low-level first attenuation control signal S1 is supplied (or in other words, when the switch SW1 is off and the switch SW5 is on), the first attenuator part 21 does not attenuate the input signal IN, and supplies the input signal IN to the second attenuator part 22 as is.

The second attenuator part 22 includes resistors R2 and R6, a switch SW2 connected to the resistor R2 in series, and a switch SW6 connected to the resistor R6 in parallel. The switch SW2 and the switch SW6 operate in a complementary manner in accordance with the signal value (high level or low level) of the second attenuation control signal S2 supplied from the attenuator control circuit 15. Specifically, when the second attenuation control signal S2 is a high-level signal, the switch SW2 is turned on, and the switch SW6 is turned off. When the second attenuation control signal S2 is a low-level signal, the switch SW2 is turned off, and the switch SW6 is turned on. When the high-level second attenuation control signal S2 is supplied (or in other words, when the switch SW2 is on and the switch SW6 is off), the second attenuator part 22 attenuates the signal supplied from the first attenuator part 21, and supplies the attenuated signal to the third attenuator part 23. When the low-level second attenuation control signal S2 is supplied (or in other words, when the switch SW2 is off and the switch SW6 is on), the second attenuator part 22 supplies the signal supplied from the first attenuator part 21 to the third attenuator part 23 without conducting attenuation.

The third attenuator part 23 includes resistors R3 and R7, a switch SW3 connected to the resistor R3 in series, and a switch SW7 connected to the resistor R7 in parallel. The switch SW3 and the switch SW7 operate in a complementary manner in accordance with the signal value (high level or low level) of the third attenuation control signal S3 supplied from the attenuator control circuit 15. Specifically, when the third attenuation control signal S3 is a high-level signal, the switch SW3 is turned on, and the switch SW7 is turned off. When the third attenuation control signal S3 is a low-level signal, the switch SW3 is turned off, and the switch SW7 is turned on. When the high-level third attenuation control signal S3 is supplied (or in other words, when the switch SW3 is on and the switch SW7 is off), the third attenuator part 23 attenuates the signal supplied from the second attenuator part 22, and supplies the attenuated signal to the fourth attenuator part 24. When the low-level third attenuation control signal S3 is supplied (or in other words, when the switch SW3 is off and the switch SW7 is on), the third attenuator part 23 supplies the signal supplied from the second attenuator part 22 to the fourth attenuator part 24 without conducting attenuation.

The fourth attenuator part 24 includes resistors R4 and R8, a switch SW4 connected to the resistor R4 in series, and a switch SW8 connected to the resistor R8 in parallel. The switch SW4 and the switch SW8 operate in a complementary manner in accordance with the signal value (high level or low level) of the fourth attenuation control signal S4 supplied from the attenuator control circuit 15. Specifically, when the fourth attenuation control signal S4 is a high-level signal, the switch SW4 is turned on, and the switch SW8 is turned off. When the fourth attenuation control signal S4 is a low-level signal, the switch SW4 is turned off, and the switch SW8 is turned on. When the high-level fourth attenuation control signal S4 is supplied (or in other words, when the switch SW4 is on and the switch SW8 is off), the fourth attenuator part 24 attenuates the signal supplied from the third attenuator part 23, and supplies the attenuated signal to the amplifier 12 as a decay signal DS. When the low-level fourth attenuation control signal S4 is supplied (or in other words, when the switch SW4 is OFF and the switch SW8 is ON), the fourth attenuator part 24 supplies the signal supplied from the third attenuator part 23 to the amplifier 12 as a decay signal DS without conducting attenuation.

As described below, the second attenuation control signal S2 reaches a high level after the first attenuation control signal S1 does, and goes down to a low level before the first attenuation control signal S1 does. Thus, when the second attenuator part 22 is turned on, the first attenuator part 21 should already be in the on state (in which the attenuation operation is conducted).

Similarly, the third attenuation control signal S3 reaches a high level after the first attenuation control signal S1 and second attenuation control signal S2 do, and goes down to a low level before the first attenuation control signal S1 and second attenuation control signal S2 do. Thus, when the third attenuator part 23 is turned on, the first attenuator part 21 and the second attenuator part 22 should already be in the on state.

The fourth attenuation control signal S4 reaches a high level after the first attenuation control signal S1, second attenuation control signal S2, and third attenuation control signal S3 do, and goes down to a low level before the first attenuation control signal S1, second attenuation controls signal S2, and third attenuation control signal S3 do. Thus, when the fourth attenuator part 24 is turned on, the first attenuator part 21, second attenuator part 22, and third attenuator part 23 should already be in the on state.

Figure 3A:
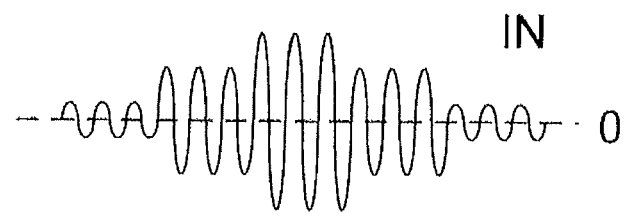
FIGS. 3A, 3B, 3C, 3D and 3E are schematic diagrams showing an input signal IN, an amplified signal AS, an amplitude value AV, and a reference threshold voltage RV.
Figure 3B:
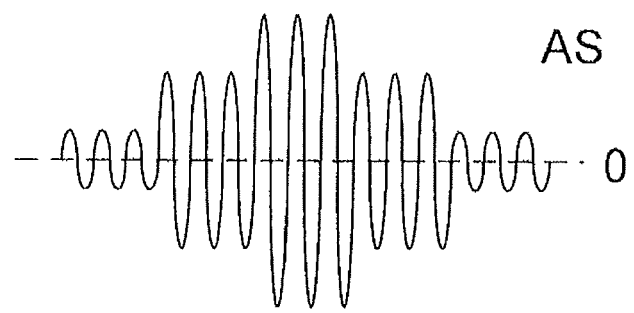

The amplifier 12 is a signal amplifier that amplifies the amplitude of the decay signal DS supplied from the step attenuator 11, and generates an amplified signal AS. If the input signal IN has the waveform shown in FIG. 3A, for example, the amplified signal AS has a waveform having a greater amplitude than that of the input signal IN as shown in FIG. 3B. The amplifier 12 outputs and supplies the amplified signal AS to the detector circuit 13.

Figure 3C:
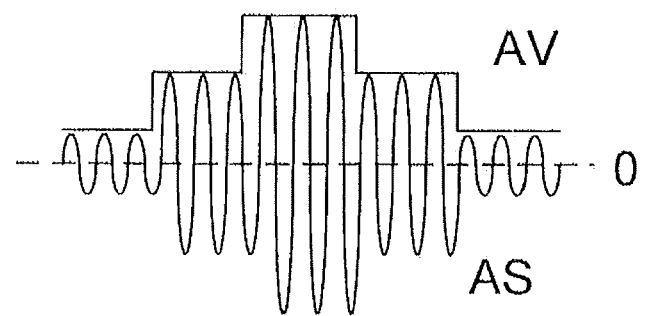

The detector circuit 13 conducts envelope detection on the amplified signal AS supplied from the amplifier 12 to remove the high-frequency component and obtain a voltage amplitude value AV (will be simply referred to as an amplitude value AV below). As shown in FIG. 3C, with this envelope detection, a shape approximate to the envelope at the peak level of the amplified signal AS can be obtained as the amplitude value AV.

Figure 3D:
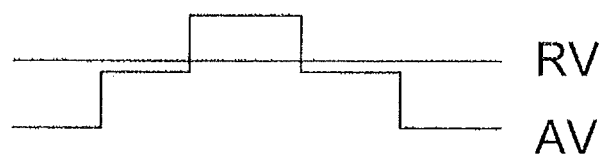

The comparator circuit 14 compares the amplitude value AV obtained by the detector circuit 13 with a prescribed reference threshold voltage RV supplied from outside. For example, as shown in FIG. 3D, the comparator circuit 14 compares the size between the amplitude value AV and the reference threshold voltage RV. The comparator circuit 14 then generates a comparison result signal CV indicating the comparison result, and supplies this signal to the attenuator control circuit 15. That is, the comparator circuit 14 generates the comparison result signal CV that indicates a high level when the amplitude value AV is greater than the reference threshold voltage RV, and a low level when the amplitude value AV is equal to or smaller than the reference threshold voltage RV, and supplies this signal to the attenuator control circuit 15.

The attenuator control circuit 15 controls the attenuation amount of the step attenuator 11, which is a variable attenuator. The attenuator control circuit 15 supplies, as an attenuation amount control signal, the first attenuation control signal S1, the second attenuation control signal S2, the third attenuation control signal S3, and the fourth attenuation control signal S4 to the corresponding attenuator parts (the first to fourth attenuator parts 21 to 24 corresponding to the first to fourth attenuation control signals S1 to S4) of the step attenuator 11, respectively.

FIG. 4 is a diagram showing the configuration of the attenuator control circuit 15. The attenuator control circuit 15 includes delay circuits 31 to 37 (first delay circuit 31, second delay circuit 32, third delay circuit 33, fourth delay circuit 34, fifth delay circuit 35, sixth delay circuit 36, and seventh delay circuit 37), each of which is an RC delay circuit including a resistor and capacitance, and AND circuits AD1 to AD3 (first AND circuit AD1, second AND circuit AD2, and third AND circuit AD3), each of which is a logic circuit.

The first delay circuit 31 is connected to the second delay circuit 32 and the third AND circuit AD3. The first delay circuit 31 generates a first delay signal TS1 by delaying the comparison result signal CV supplied from the comparator circuit 14 by a delay period DT, which is a prescribed time period, and supplies the first delay signal TS1 to the second delay circuit 32 and the third AND circuit AD3.

The second delay circuit 32 is connected to the first delay circuit 31, the third delay circuit 33, and the second AND circuit AD2. The second delay circuit 32 generates a second delay signal TS2 by delaying the first delay signal TS1 supplied from the first delay circuit 31 by the delay period DT, and supplies the second delay signal TS2 to the third delay circuit 33 and the second AND circuit AD2.

The third delay circuit 33 is connected to the second delay circuit 32, the fourth delay circuit 34, and the first AND circuit AD1. The third delay circuit 33 generates a third delay signal TS3 by delaying the second delay signal TS2 supplied from the second delay circuit 32 by the delay period DT, and supplies the third delay signal TS3 to the fourth delay circuit 34 and the first AND circuit AD1.

The fourth delay circuit 34 is connected to the third delay circuit 33 and the fifth delay circuit 35. The fourth delay circuit 34 generates a fourth delay signal TS4 by delaying the third delay signal TS3 supplied from the third delay circuit 33 by the delay period DT, and supplies the fourth delay signal TS4 to the fifth delay circuit 35. The fourth delay circuit 34 also outputs the fourth delay signal TS4 as the first attenuation control signal S1. That is, the first attenuation control signal S1 is a delay signal that is delayed from the comparison result signal CV by a delay period that is four times as long as the prescribed delay period DT.

The fifth delay circuit 35 is connected to the fourth delay circuit 34 and the first AND circuit AD1. The fifth delay circuit 35 generates a fifth delay signal TS5 by delaying the fourth delay signal TS4 supplied from the fourth delay circuit 34 by the delay period DT, and supplies the fifth delay signal TS5 to the first AND circuit AD1.

The first AND circuit AD1 is connected to the third delay circuit 33, the fifth delay circuit 35, and the sixth delay circuit 36. The first AND circuit AD1 receives the third delay signal TS3 at one input terminal and the fifth delay signal TS5 at the other input terminal, and generates a first AND signal LS1, which is a logical AND of the two signals. The first AND circuit AD1 supplies the first AND signal LS1 to the sixth delay circuit 36, and outputs the first AND signal LS1 as the second attenuation control signal S2. That is, the second attenuation control signal S2 is a signal obtained as a logical AND of a delay signal that is delayed from the comparison result signal CV by a delay period that is five times as long as the prescribed delay period DT, and a delay signal that is delayed from the comparison result signal CV by a delay period that is three times as long as the prescribed delay period DT.

The sixth delay circuit 36 is connected to the first AND circuit AD1 and the second AND circuit AD2. The sixth delay circuit 36 generates a sixth delay signal TS6 by delaying the first AND signal LS1 supplied from the first AND circuit AD1 by the delay period DT, and supplies the sixth delay signal TS6 to the second AND circuit AD2.

The second AND circuit AD2 is connected to the second delay circuit 32, the sixth delay circuit 36, and the seventh delay circuit 37. The second AND circuit AD2 receives the second delay signal TS2 at one input terminal and the sixth delay signal TS6 at the other input terminal, and generates a second AND signal LS2, which is a logical AND of the two signals. The second AND circuit AD2 supplies the second AND signal LS2 to the seventh delay circuit 37, and outputs the second AND signal LS2 as the third attenuation control signal S3. That is, the third attenuation control signal S3 is a signal obtained as a logical AND of a delay signal that is delayed from the second attenuation control signal S2 by the delay period DT, and a delay signal that is delayed from the comparison result signal CV by a delay period that is twice as long as the prescribed delay period DT.

The seventh delay circuit 37 is connected to the second AND circuit AD2 and the third AND circuit AD3. The seventh delay circuit 37 generates a seventh delay signal TS7 by delaying the second AND signal LS2 supplied from the second AND circuit AD2 by the delay period DT, and supplies the seventh delay signal TS7 to the third AND circuit AD3.

The third AND circuit AD3 is connected to the first delay circuit 31 and the seventh delay circuit 37. The third AND circuit AD3 receives the first delay signal TS1 at one input terminal and the seventh delay signal TS7 at the other input terminal, and generates a third AND signal LS3, which is a logical AND of the two signals. The third AND circuit AD3 also outputs the third AND signal LS3 as the fourth attenuation control signal S4. That is, the fourth attenuation control signal S4 is a signal obtained as a logical AND of a delay signal that is delayed from the third attenuation control signal S3 by the delay period DT, and a delay signal that is delayed from the comparison result signal CV by the prescribed delay period DT.

The second attenuation control signal S2 generated by the operations described above reaches a high level later than the first attenuation control signal S1 by the delay period DT, and goes down to a low level sooner than the first attenuation control signal S1 by the delay period DT. The third attenuation control signal S3 reaches a high level later than the second attenuation control signal S2 by the delay period DT, and goes down to a low level sooner than the second attenuation control signal S2 by the delay period DT. The fourth attenuation control signal S4 reaches a high level later than the third attenuation control signal S3 by the delay period DT, and goes down to a low level sooner than the third attenuation control signal S3 by the delay period DT.

Figure 5:
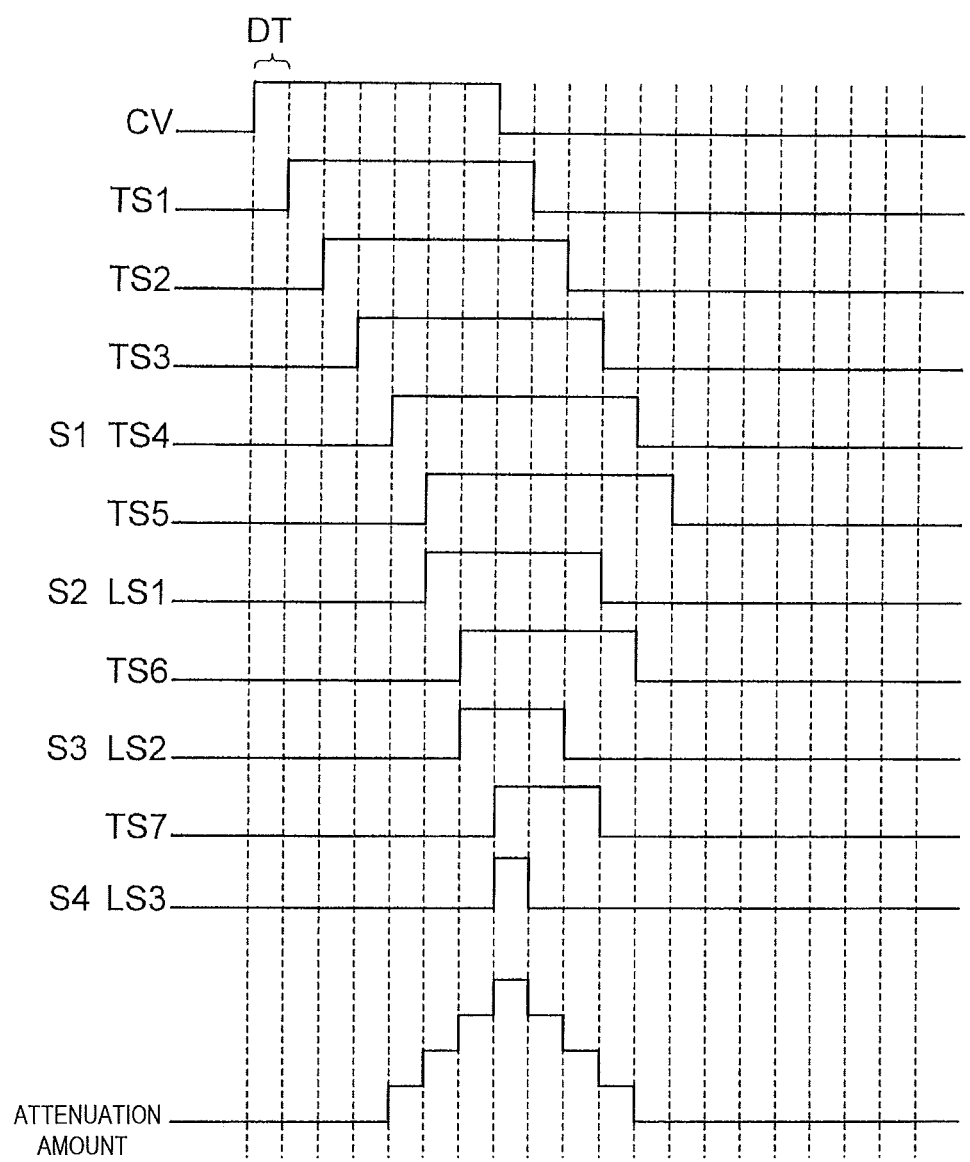
FIG. 5 is a time chart showing an example of each signal generated in the attenuator control circuit.

FIG. 5 is a time chart showing an example of respective signals generated in the attenuator control circuit 15 and the attenuation amount in the step attenuator 11 in a case in which the comparison result signal CV stays at a high level during a period of time that is seven times as long as the delay period DT (or in other words, 7DT).

The first attenuation control signal S1, the second attenuation control signal S2, the third attenuation control signal S3, and the fourth attenuation control signal S4 transition from low to high in the order of S1, S2, S3, and S4, and from high to low in the order of S4, S3, S2, and S1. Thus, when the first attenuator part 21 is turned on, the attenuation amount increases by one step, and subsequently, when the second attenuator part 22, the third attenuator part 23, and the fourth attenuator part 24 are turned on in this order, respectively, the attenuation amount increases by one step at a time. On the other hand, when the fourth attenuator part 24 is turned off, the attenuation amount decreases by one step, and subsequently, when the third attenuator part 23, the second attenuator part 22, and the first attenuator part 21 are turned off in this order, respectively, the attenuation amount decreases by one step at a time. This way, as shown at the bottom of FIG. 5, the temporal change of the attenuation amount of the step attenuator 11 has a step-like waveform having the high-level period of the fourth attenuation control signal S4 as the peak thereof.

Figure 6:
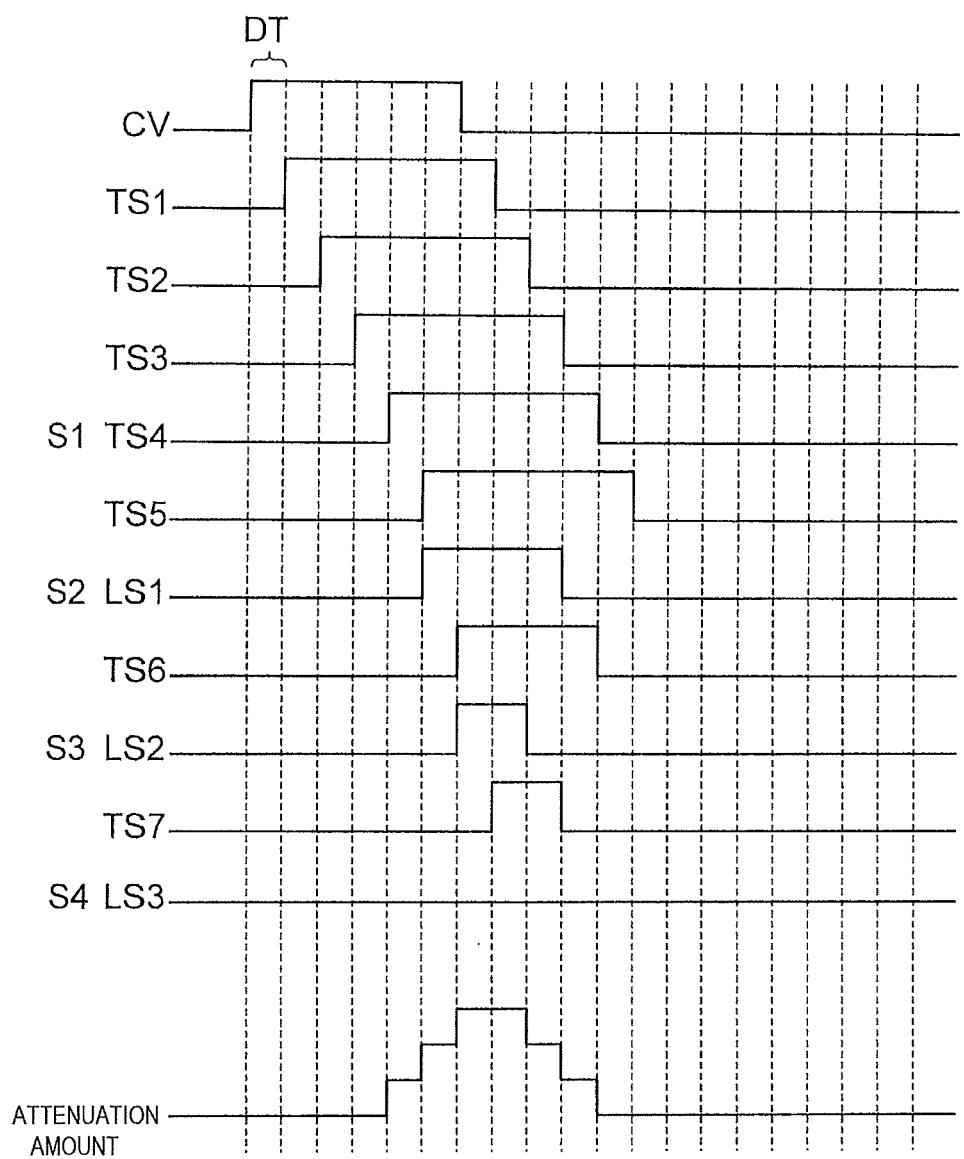
FIG. 6 is a time chart showing an example of each signal generated in the attenuator control circuit.

FIG. 6 is a time chart showing an example of respective signals generated in the attenuator control circuit 15 and the attenuation amount in the step attenuator 11 in a case in which the comparison result signal CV stays at a high level during a period of time that is six times as long as the delay period DT (or in other words, 6DT). Unlike the time chart shown in FIG. 5, the first delay signal TS1 transitions from high to low when the seventh delay signal TS7 transitions from low to high. Thus, the third AND signal LS3, which is the fourth attenuation control signal S4, stays at a low level without going up to a high level. This way, as shown at the bottom of FIG. 6, the temporal change of the attenuation amount of the step attenuator 11 has a step-like waveform having the high-level period of the third attenuation control signal S3 as the peak thereof.

Figure 7:
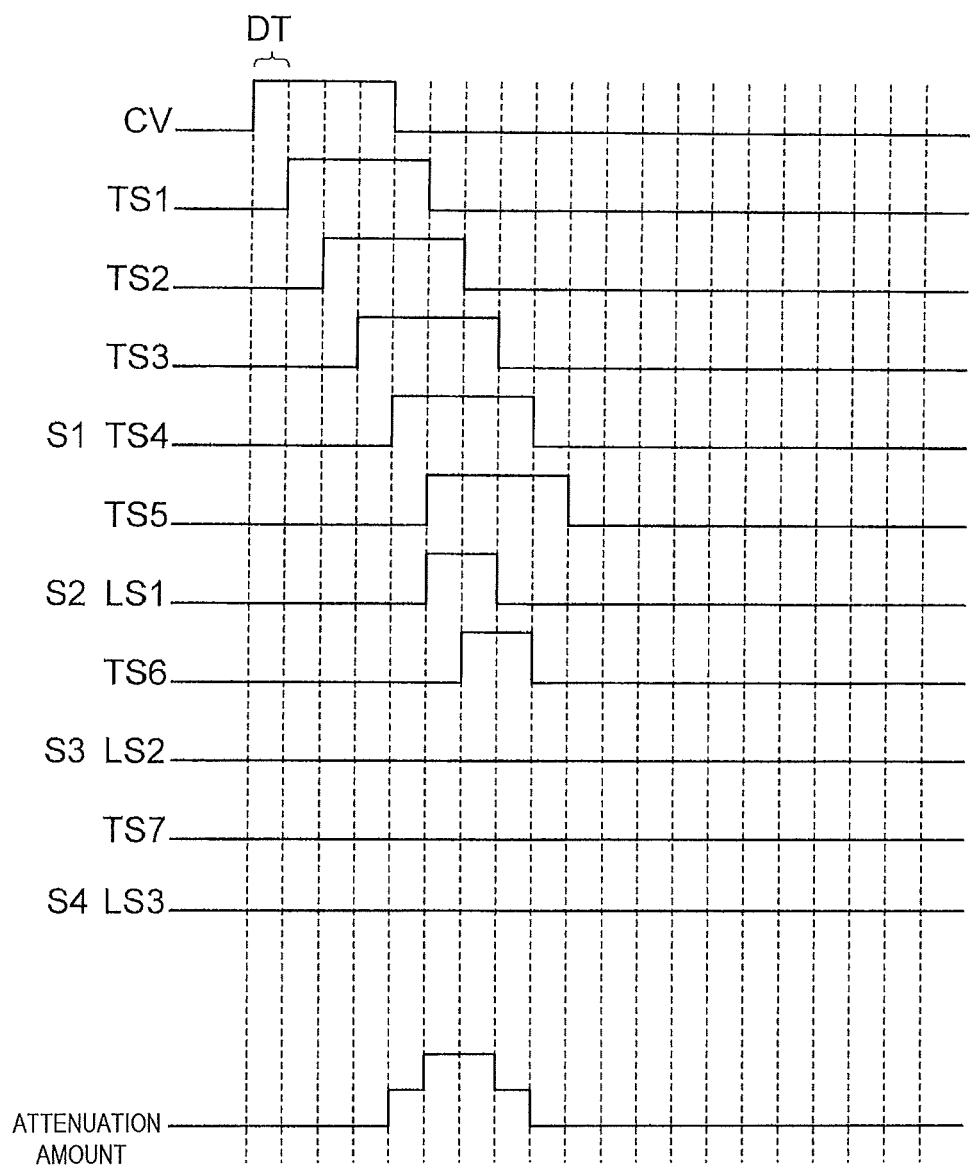
FIG. 7 is a time chart showing an example of each signal generated in the attenuator control circuit.

FIG. 7 is a time chart showing an example of respective signals generated in the attenuator control circuit 15 and the attenuation amount in the step attenuator 11 in a case in which the comparison result signal CV stays at a high level during a period of time that is four times as long as the delay period DT (or in other words, 4DT). Unlike the time chart shown in FIG. 5 or FIG. 6, the second delay signal TS2 transitions from high to low when the sixth delay signal TS6 transitions from low to high. Thus, the second AND signal LS2, which is the third attenuation control signal S3, stays at a low level without going up to a high level. This way, as shown at the bottom of FIG. 7, the temporal change of the attenuation amount of the step attenuator 11 has a step-like waveform having the high-level period of the second attenuation control signal S2 as the peak thereof.

Figure 8:
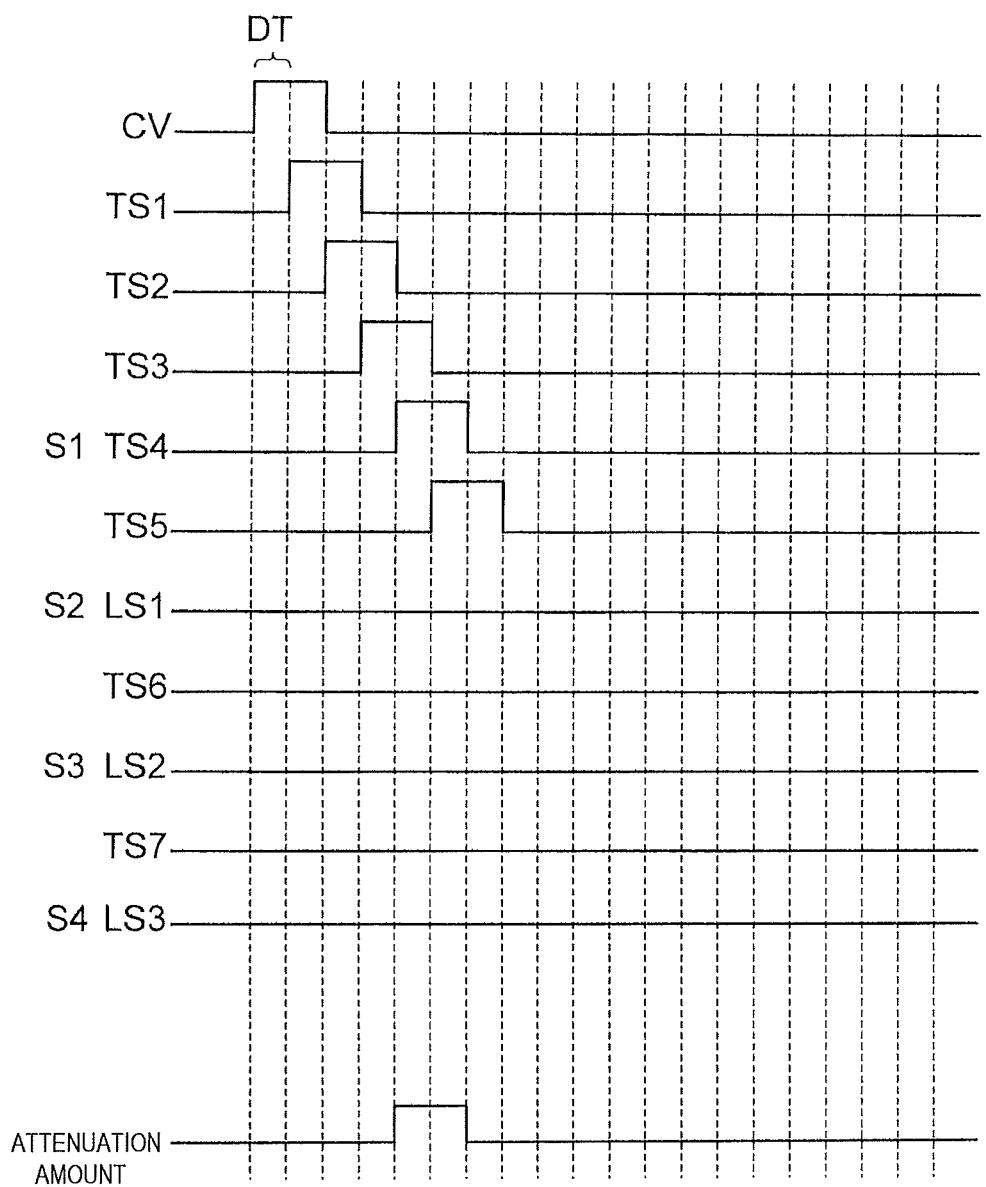
FIG. 8 is a time chart showing an example of each signal generated in the attenuator control circuit.

FIG. 8 is a time chart showing an example of respective signals generated in the attenuator control circuit 15 and the attenuation amount in the step attenuator 11 in a case in which the comparison result signal CV stays at a high level during a period of time that is twice as long as the delay period DT (or in other words, 2DT). Unlike the time chart shown in FIG. 5, 6, or 7, the third delay signal TS3 transitions from high to low when the fifth delay signal TS5 transitions from low to high. Thus, the first AND signal LS1, which is the second attenuation control signal S2, stays at a low level without going up to a high level. This way, as shown at the bottom of FIG. 8, the temporal change of the attenuation amount of the step attenuator 11 has a step-like waveform having the high-level period of the first attenuation control signal S1 as the peak thereof.

Figure 9:
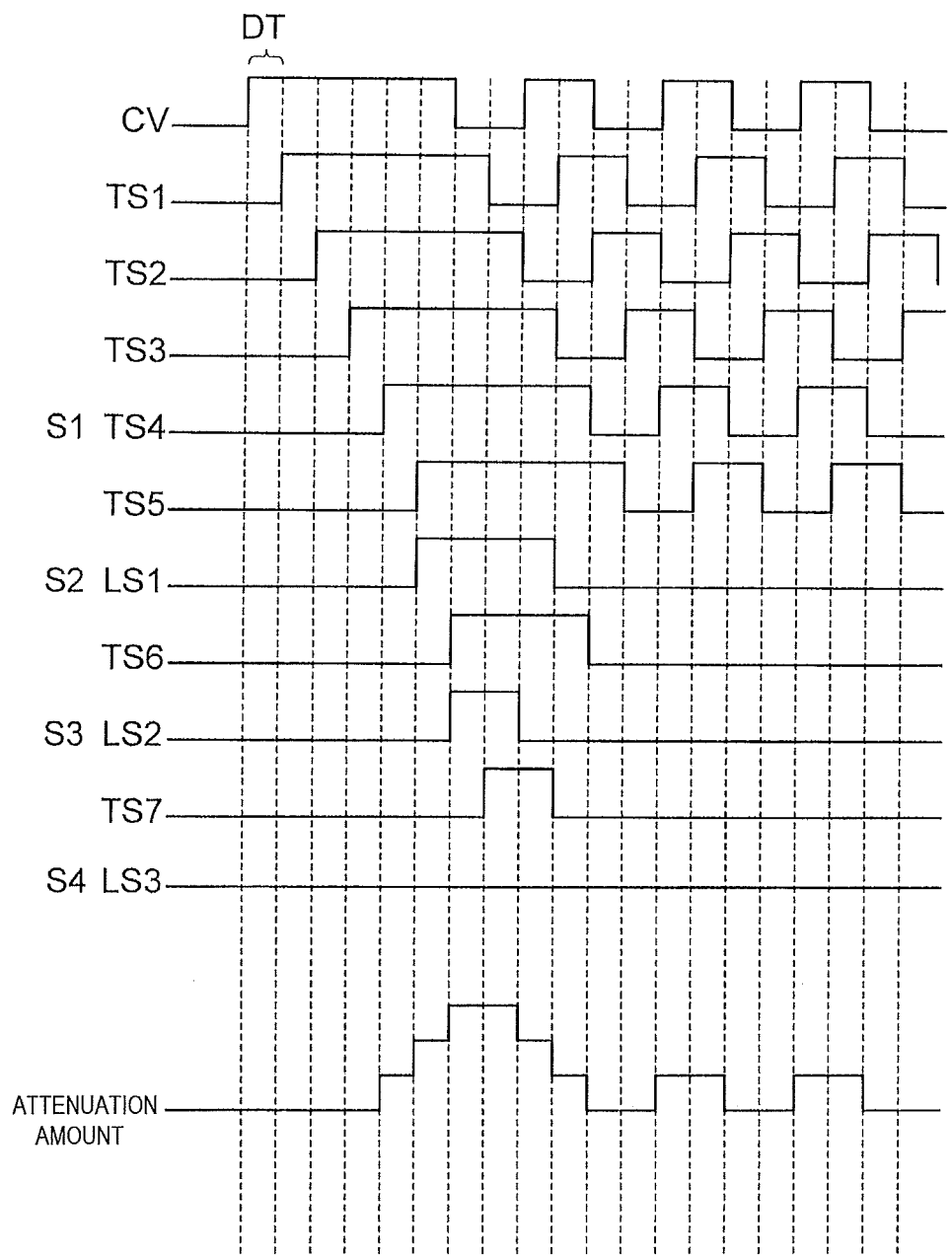
FIG. 9 is a time chart showing an example of each signal in a steady state.

FIG. 9 is a time chart showing an example of respective signals generated in the attenuator control circuit 15 and the attenuation amount of the step attenuator 11 in the steady state in which the comparison result signal CV repeatedly transitions from high to low and low to high. This steady state occurs when the amplitude value AV of the amplified signal AS obtained from the detector circuit 13 repeatedly goes below the reference threshold voltage RV because of the attenuation operation of the step attenuator 11, and goes above the reference threshold voltage RV by the suspension of the attenuation operation of the attenuator 11, for example. FIG. 9 shows an example in which the comparison result signal CV stays at a high level for a period that is six times as long as the delay period DT (that is, 6DT), and thereafter, repeatedly transitions between high and low at a time interval of 2DT.

Because the first delay signal TS1 is delayed from the comparison result signal CV by the delay period DT, the first delay signal TS1 repeatedly transitions between high and low at a time interval of 2DT in a manner similar to the comparison result signal CV. Also, because the second delay signal TS2, the third delay signal TS3, the fourth delay signal TS4 (the first attenuation control signal S1), and the fifth delay signal TS5 are respectively delayed from the first delay signal TS1, the second delay signal TS2, the third delay signal TS3, and the fourth delay signal TS4 by the delay period DT, the second to fifth delay signals TS2 to TS5 transition between high and low at a time interval of 2DT in a manner similar to the first delay signal TS1.

On the other hand, in the repetition period described above, the third delay signal TS3 and the fifth delay signal TS5 repeatedly transition between high and low in a complementary manner, and therefore, the first AND signal LS1 (second attenuation control signal S2), which is a logical AND of the two signals, stays at a low level. The second AND signal LS2 (third attenuation control signal S3), which is a signal representing a logical AND of the second delay signal TS2 and the sixth delay signal TS6 that is delayed from the first AND signal LS1 by the delay period DT, stays at a low level during the repetition period described above. The third AND signal LS3 (fourth attenuation control signal S4), which is a signal representing a logical AND of the first delay signal TS1 and the seventh delay signal TS7 that is delayed from the second AND signal LS2 by the delay period DT, stays at a low level during the repetition period described above.

Thus, in the steady state, only the first attenuation control signal S1 repeatedly transitions between high and low. Therefore, as shown at the bottom of FIG. 9, the temporal change of the attenuation amount of the step attenuator 11 is represented by a waveform having a step-like shape going down in the end and followed by repeated transition between high and low at a time interval of 2DT.

As described above, according to the present invention, if the amplitude value AV of the amplified signal AS, which reflects the intensity of the input signal IN, is higher than the reference threshold voltage RV, the attenuation amount of the step attenuator 11 increases by one step at a time. Thereafter, the attenuation amount of the step attenuator 11 decreases by one step at time so as to correspond to the time lapse of the period in which the amplitude value AV is higher than the reference threshold voltage RV. As a result, even if the signal intensity of the input signal IN suddenly changes, the gain change always occurs with a minimal amount, and therefore, the amount of noise generated is smaller than the case in which a change amount between respective steps is great.

The attenuator control circuit 15 of the present invention is constituted of delay circuits and logical circuits (AND circuits) such as RC circuits. Because an AD converter that operates at high speed and the like are not necessary, it is possible to suppress the generation of noise with a simple configuration.

Embodiment 2

Figure 10:
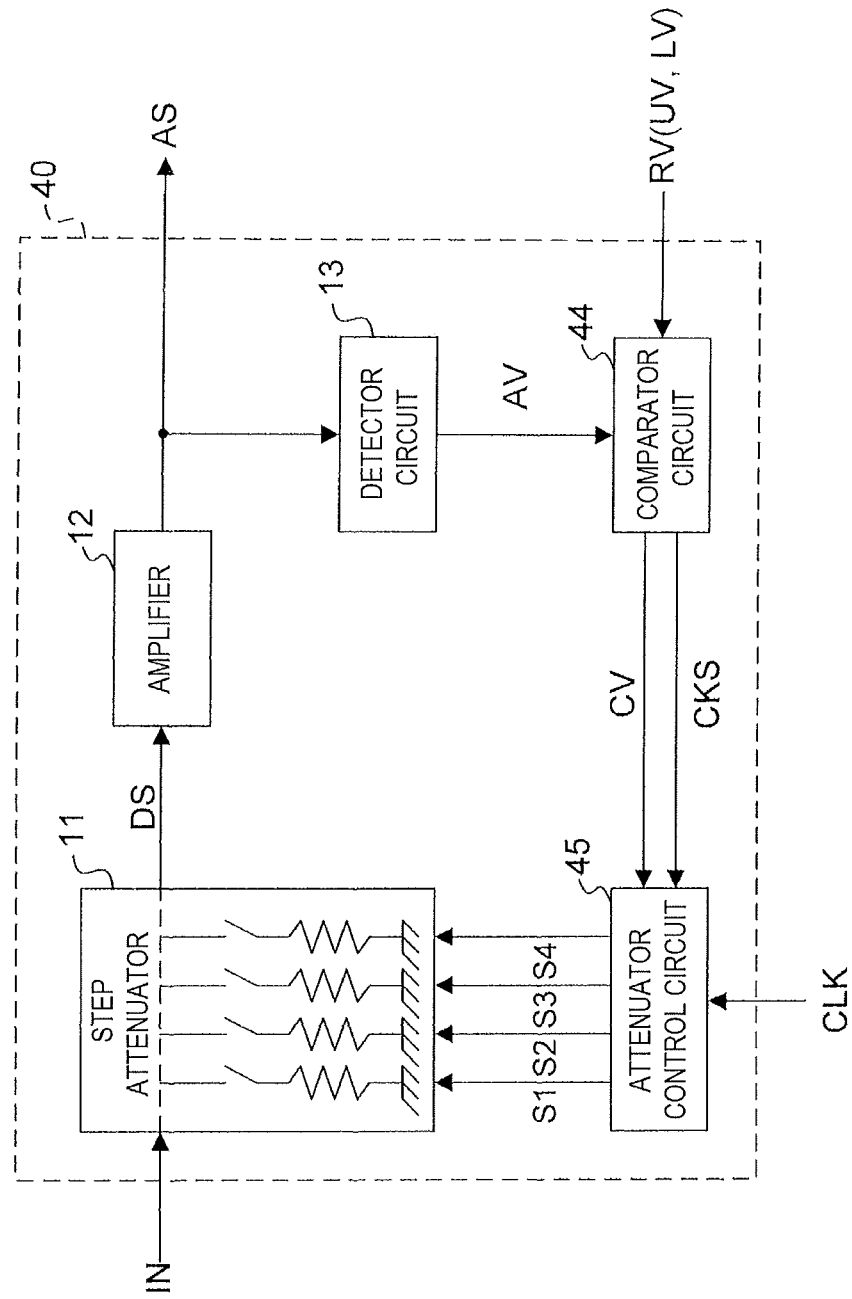
FIG. 10 is a block diagram showing the configuration of a gain control circuit in Embodiment 2.

FIG. 10 is a block diagram showing the configuration of a gain control circuit 40 in this embodiment. Below, configurations similar to those of Embodiment 1 will be given the same reference characters, and the descriptions thereof will be omitted. The gain control circuit 40 includes a step attenuator 11, an amplifier 12, a detector circuit 13, a comparator circuit 44, and an attenuator control circuit 45.

Figure 3E:
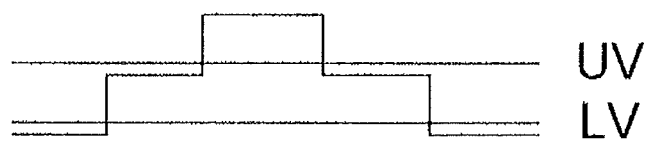

The comparator circuit 44 receives the reference threshold voltage RV from outside. In this embodiment, the reference threshold voltage RV includes an upper limit threshold voltage UV and a lower limit threshold voltage LV. As schematically shown in FIG. 3E, the comparator circuit 44 compares the amplitude value AV of the amplified signal AS obtained by the detector circuit 13 with the values of the upper limit threshold voltage UV and the lower limit threshold voltage LV.

When the comparator circuit 44 determines that the amplitude value AV is greater than the value of the upper limit threshold voltage UV, the comparator circuit 44 generates and supplies a high-level comparison result signal CV to the attenuator control circuit 45. On the other hand, when the comparator circuit 44 determines that the amplitude value AV is smaller than the value of the lower limit threshold voltage LV, the comparator circuit 44 generates and supplies a low-level comparison result signal CV to the attenuator control circuit 45. When the amplitude value AV is equal to or greater than the lower limit threshold voltage LV and not exceeding the upper limit threshold voltage UV, the comparator circuit 44 supplies, to the attenuator control circuit 45, a clock stop signal CKS that stops the clock signal CLK supplied to the attenuator control circuit 45.

Figure 11:
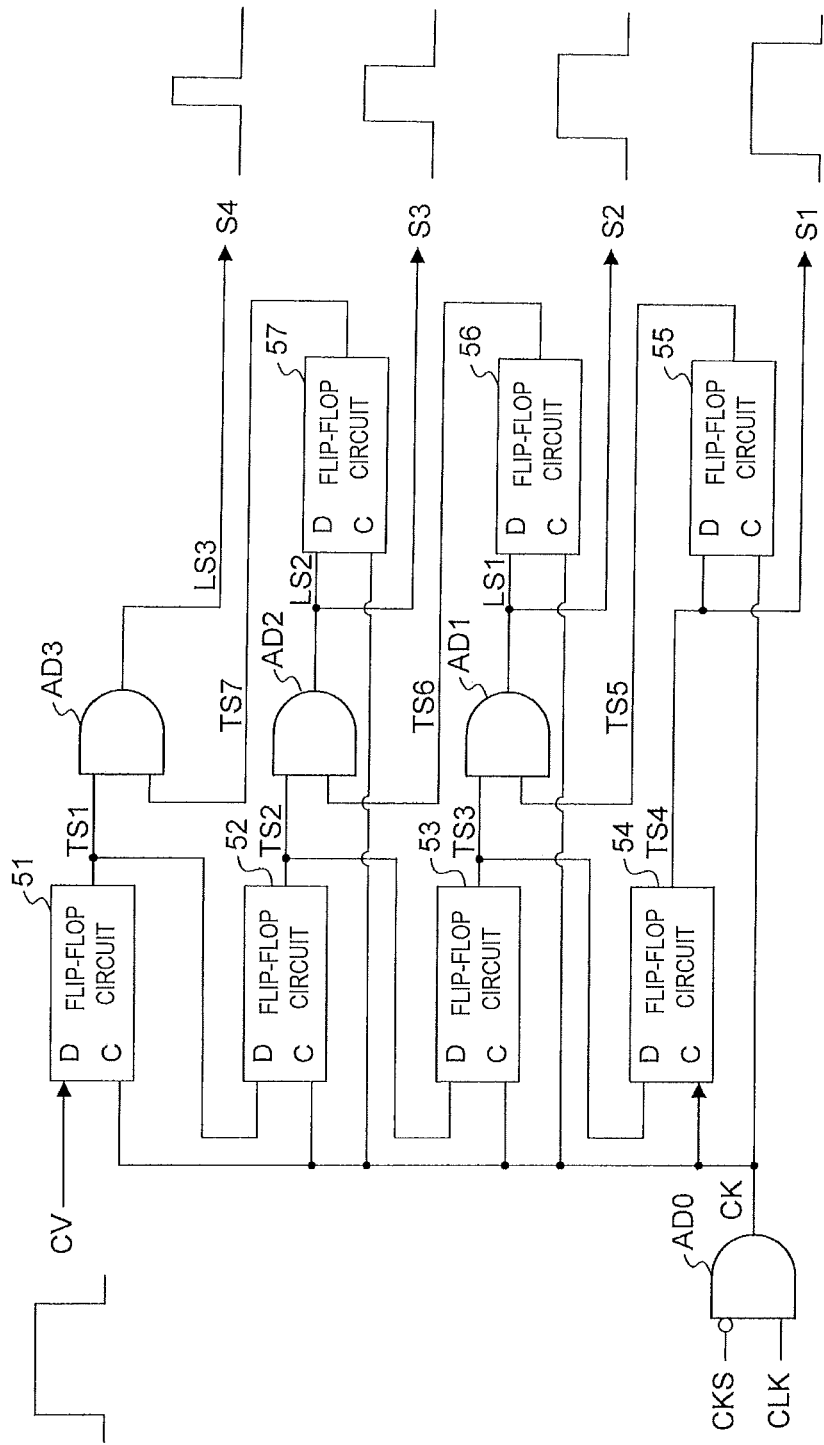
FIG. 11 is a circuit diagram showing the configuration of a step attenuator in Embodiment 2.

FIG. 11 is a diagram showing the configuration of the attenuator control circuit 45. The attenuator control circuit 45 includes flip-flop circuits 51 to 57 (first flip-flop circuit 51, second flip-flop circuit 52, third flip-flop circuit 53, fourth flip-flop circuit 54, fifth flip-flop circuit 55, sixth flip-flop circuit 56, and seven flip-flop circuit 57) that each are a D-type flip-flop circuit, and AND circuits AD0 to AD3 (clock control AND circuit AD0, first AND circuit AD1, second AND circuit AD2, and third AND circuit AD3) that each are a logic circuit. The clock terminal of each flip-flop circuit (indicated with C in the figure) is connected to the output terminal of the clock control AND circuit AD0.

The clock control AND circuit AD0 is configured such that one input terminal thereof receives the clock signal CLK supplied from outside, and the other input terminal receives the clock stop signal CKS from the comparator circuit 44. When the clock stop signal CKS is not supplied from the comparator circuit 44, the clock control AND circuit AD0 outputs the clock signal CLK from the output terminal and supplies the clock signal CLK to the respective flip-flop circuits 51 to 57. On the other hand, when clock stop signal CKS is supplied from the comparator circuit 44, the clock control AND circuit AD0 stops the supply of the clock signal CLK to the respective flip-flop circuits 51 to 57.

The first flip-flop circuit 51 is connected to the second flip-flop circuit 52 and the third AND circuit AD3. While the clock signal CLK is supplied to the clock terminal, the first flip-flop circuit 51 generates the first delay signal TS1 by delaying the comparison result signal CV supplied from the comparator circuit 44 by the delay period DT, and supplies the first delay signal TS1 to the second flip-flop circuit 52 and the third AND circuit AD3. When the supply of the clock signal CLK to the clock terminal is stopped, the first flip-flop circuit 51 supplies the first delay signal TS1 that maintains a signal value immediately before the stop of the signal supply to the second flip-flop circuit 52 and the third AND circuit AD3.

The second flip-flop circuit 52 is connected to the first flip-flop circuit 51, the third flip-flop circuit 53, and the second AND circuit AD2. While the clock signal CLK is supplied to the clock terminal, the second flip-flop circuit 52 generates the second delay signal TS2 by delaying the first delay signal TS1 supplied from the first flip-flop circuit 51 by the delay period DT, and supplies the second delay signal TS2 to the third flip-flop circuit 53 and the second AND circuit AD2. When the supply of the clock signal CLK to the clock terminal is stopped, the second flip-flop circuit 52 supplies the second delay signal TS2 that maintains a signal value immediately before the stop of the signal supply to the third flip-flop circuit 53 and the second AND circuit AD2.

The third flip-flop circuit 53 is connected to the second flip-flop circuit 52, the fourth flip-flop circuit 54, and the first AND circuit AD1. While the clock signal CLK is supplied to the clock terminal, the third flip-flop circuit 53 generates the third delay signal TS3 by delaying the second delay signal TS2 supplied from the second flip-flop circuit 52 by the delay period DT, and supplies the third delay signal TS3 to the fourth flip-flop circuit 54 and the first AND circuit AD1. When the supply of the clock signal CLK to the clock terminal is stopped, the third flip-flop circuit 53 supplies the third delay signal TS3 that maintains a signal value immediately before the stop of the signal supply to the fourth flip-flop circuit 54 and the first AND circuit AD1.

The fourth flip-flop circuit 54 is connected to the third flip-flop circuit 53 and the fifth flip-flop circuit 55. While the clock signal CLK is supplied to the clock terminal, the fourth flip-flop circuit 54 generates the fourth delay signal TS4 by delaying the third delay signal TS3 supplied from the third flip-flop circuit 53 by the delay period DT, and outputs the fourth delay signal TS4 as the first attenuation control signal S1. The fourth flip-flop circuit 54 also supplies the fourth delay signal TS4 to the fifth flip-flop circuit 55. When the supply of the clock signal CLK to the clock terminal is stopped, the fourth flip-flop circuit 54 supplies the fourth delay signal TS4 that maintains a signal value immediately before the stop of the signal supply to the fifth flip-flop circuit 55, and outputs the fourth delay signal TS4 as the first attenuation control signal S1. That is, the first attenuation control signal S1 is a delay signal that is delayed from the comparison result signal CV by a delay period that is four times as long as the prescribed delay period DT.

The fifth flip-flop circuit 55 is connected to the fourth flip-flop circuit 54 and the first AND circuit AD1. While the clock signal CLK is supplied to the clock terminal, the fifth flip-flop circuit 55 generates the fifth delay signal TS5 by delaying the fourth delay signal TS4 supplied from the fourth flip-flop circuit 54 by the delay period DT, and supplies the fifth delay signal TS5 to the first AND circuit AD1. When the supply of the clock signal CLK to the clock terminal is stopped, the fifth flip-flop circuit 55 supplies the fifth delay signal TS5 that maintains a signal value immediately before the stop of the signal supply to the first AND circuit AD1.

The first AND circuit AD1 is connected to the third flip-flop circuit 53, the fifth flip-flop circuit 55, and the sixth flip-flop circuit 56. The first AND circuit AD1 receives the third delay signal TS3 at one input terminal and the fifth delay signal TS5 at the other input terminal, and generates the first AND signal LS1, which is a logical AND of the two signals. The first AND circuit AD1 supplies the first AND signal LS1 to the sixth flip-flop circuit 56, and outputs the first AND signal LS1 as the second attenuation control signal S2. That is, the second attenuation control signal S2 is a signal representing a logical AND of a delay signal delayed from the comparison result signal CV by a delay period that is five times as long as the delay period DT, and a delay signal delayed from the comparison result signal CV by a delay period that is three times as long as the delay period DT.

The sixth flip-flop circuit 56 is connected to the first AND circuit AD1 and the second AND circuit AD2. While the clock signal CLK is supplied to the clock terminal, the sixth flip-flop circuit 56 generates the sixth delay signal TS6 by delaying the first AND signal LS1 supplied from the first AND circuit AD1 by the delay period DT, and supplies the sixth delay signal TS6 to the second AND circuit AD2. When the supply of the clock signal CLK to the clock terminal is stopped, the sixth flip-flop circuit 56 supplies the sixth delay signal TS6 that maintains a signal value immediately before the stop of the signal supply to the second AND circuit AD2.

The second AND circuit AD2 is connected to the second flip-flop circuit 52, the sixth flip-flop circuit 56, and the seventh flip-flop circuit 57. The second AND circuit AD2 receives the second delay signal TS2 at one input terminal and the sixth delay signal TS6 at the other input terminal, and generates a second AND signal LS2, which is a logical AND of the two signals. The second AND circuit AD2 supplies the second AND signal LS2 to the seventh flip-flop circuit 57, and outputs the second AND signal LS2 as the third attenuation control signal S3. That is, the third attenuation control signal S3 is a signal representing a logical AND of a delay signal that is delayed from the second attenuation control signal S2 by the delay period DT, and a delay signal delayed from the comparison result signal CV by a delay period that is twice as long as the delay period DT.

The seventh flip-flop circuit 57 is connected to the second AND circuit AD2 and the third AND circuit AD3. While the clock signal CLK is supplied to the clock terminal, the seventh flip-flop circuit 57 generates the seventh delay signal TS7 by delaying the second AND signal LS2 supplied from the second AND circuit AD2 by the delay period DT, and supplies the seventh delay signal TS7 to the third AND circuit AD3. When the supply of the clock signal CLK to the clock terminal is stopped, the seventh flip-flop circuit 57 supplies the seventh delay signal TS7 that maintains a signal value immediately before the stop of the signal supply to the third AND circuit AD3.

The third flip-flop circuit AD3 is connected to the first flip-flop circuit 51 and the seventh flip-flop circuit 57. The third AND circuit AD3 receives the first delay signal TS1 at one input terminal and the seventh delay signal TS7 at the other input terminal, and generates a third AND signal LS3, which is a logical AND of the two signals. The third AND circuit AD3 also outputs the third AND signal SL3 as the fourth attenuation control signal S4. That is, the fourth attenuation control signal S4 is a signal representing a logical AND of a delay signal that is delayed from the third attenuation control signal S3 by the delay period DT, and a delay signal delayed from the comparison result signal CV by a delay period that is equal to the delay period DT.

FIG. 12 is a time chart showing an example of the respective signals generated in the attenuator control circuit 45 and the attenuation amount of the step attenuator 11 when the clock signal CLK is supplied to the respective flip-flop circuits, or in other words, when the clock stop signal CKS is not supplied to the attenuator control circuit 45 from the comparator circuit 44. When the clock stop signal CKS is not supplied, the clock control AND circuit AD0 continues to supply the clock signal CLK to the respective flip-flop circuits 51 to 57. When the clock signal CLK is supplied, in a manner similar to the respective delay circuits 31 to 37 of Embodiment 1, each of the flip-flop circuits 51 to 57 delays a signal supplied from the preceding flip-flop circuit or AND circuit by the delay period DT. Thus, the waveform of each signal has a shape similar to that of the waveform shown in the time chart of FIG. 5 in Embodiment 1. The temporal change in attenuation amount of the step attenuator 11 also has a waveform similar to that shown at the bottom of the time chart of FIG. 5.

FIG. 13 is a time chart showing an example of the respective signals and the attenuation amount of the step attenuator 11 when the amplitude value AV first exceeds the upper limit threshold voltage UV, then goes below the upper limit threshold voltage UV after the period 7DT has passed, and enters into the steady state of going up and down between the upper limit threshold voltage UV and the lower limit threshold voltage LV. When the amplitude value AV is between the upper limit threshold voltage UV and the lower limit threshold voltage LV, the clock stop signal CKS is supplied from the comparator circuit 44 to the clock control AND circuit AD0, and the supply of the clock signal CLK from the clock control AND circuit AD0 to the respective flip-flop circuits 51 to 57 is stopped.

When the supply of the clock signal CLK is stopped, the output of each of the flip-flop circuits 51 to 57 maintains the state immediately before the supply of the clock signal CLK is stopped. Thus, the first delay signal TS1 to the seventh delay signal TS7 stay at a high level. The first AND signal LS1 to the third AND signal LS3 also stay at a high level. Therefore, the attenuation amount of the step attenuator 11 increases by one step at a time until the supply of the clock signal CLK is stopped, and stays at the same level after the supply of the clock signal CLK is stopped.

As described above, in the gain control circuit 40 of this embodiment, in the steady state, the attenuation amount does not change by one step at a time unlike FIG. 9 of Embodiment 1, but instead the attenuation amount of the step attenuator 11 remains constant. With this configuration, even if there is an error in intensity measurement of the input signal IN (or amplified signal AS that reflects the intensity of the input signal IN) due to temperature or other factors, it is possible to obtain a stable attenuation amount without being affected by the error.

Also, with this configuration, the attenuation amount can be controlled by changing the frequency of the clock signal CLK. Thus, it is possible to flexibly address a rate of intensity change of the input signal IN (or amplified signal AS that reflects the intensity of the input signal IN).

The present invention is not limited to the respective embodiments above. For example, in Embodiments 1 and 2 above, the example in which the step attenuator 11 has four attenuator parts, and the attenuator control circuit 15 (45) supplies four attenuation signals to the four corresponding attenuator parts of the step attenuator 11 was described. However, the number of the attenuator parts or the attenuation signals is not limited to this, and the step attenuator 11 may have n-number of attenuator parts (n is an integer of 2 or greater), and the attenuator control circuit 15 (45) may supply n number of attenuation control signals. That is, the step attenuator 11 has the first to n-th attenuator parts each configured to conduct an attenuation process on the input signal. The attenuator control circuit 15 supplies, as the attenuation amount control signal, the first to n-th attenuation control signals to the first to n-th attenuator parts of the step attenuator 11, the first to n-th attenuation control signals being configured to operate the first to n-th attenuator parts in first to n-th periods that start at a prescribed time interval. In Embodiments 1 and 2 above, this configuration was explained with reference to an example in which n=4.

When the step attenuator 11 has the n-number of attenuator parts (first to n-th attenuator parts), the attenuator control circuit 15 (45) generates the first attenuation control signal that is a delay signal obtained by delaying the comparison result signal by a delay period that is n-times as long as the prescribed time period, and generates the second attenuation control signal that is an AND signal of a delay signal obtained by delaying the comparison result signal by a delay period that is (n+1) times as long as the prescribed time period and a delay signal obtained by delaying the comparison result signal by a delay period that is (n−1) times as long as the prescribed time period. The attenuator control circuit 15 (45) also generates the third to n-th attenuation control signals where the k-th attenuation control signal (3≤k≤n) is an AND signal of a signal obtained by delaying the (k−1) attenuation control signal by the prescribed time period and a delay signal obtained by delaying the comparison result signal by a delay period that is (n−k+1) times as long as the prescribed time period.

The relationship between the length of the delay period DT and the comparison result signal CV is not limited to that described in the embodiments above. For example, by making the length of the delay period DT longer than the time required for the comparator circuit 14 (44) to transmit the comparison result signal CV, the steady state shown in FIGS. 9 and 13 can be achieved with ease.

What is claimed is:

1. A gain control circuit for performing gain control on an input signal, comprising:
    an attenuator including first to n-th attenuator parts that are configured to attenuate the input signal respectively in accordance with first to n-th attenuation control signals, to thereby generate an attenuated input signal, n being an integer larger than 2;
    a signal amplifier configured to amplify the attenuated input signal;
    a detector circuit configured to perform an envelope detection on the amplified attenuated input signal, to thereby obtain an amplitude value;
    a comparator circuit configured to compare the amplitude value with a reference threshold value, to thereby generate a comparison result signal indicating a result of the comparison; and
    an attenuator control circuit configured to generate the first to n-th attenuation control signals using the comparison result signal, and to supply the first to n-th attenuation control signals to the first to n-th attenuator parts, respectively, wherein
    each of the first to n-th attenuator parts attenuates the input signal at a respective timing and for a respective time period, based on a duration in which the amplitude value is greater than the reference threshold value as determined by the comparator circuit, the respective time period being set to N-times of a prescribed time interval by a corresponding one of the first to n-th attenuation control signals, N being an integer larger than 2.

2. A gain control circuit, comprising:
    an attenuator including first to n-th attenuator parts that are configured to attenuate the input signal respectively in accordance with first to n-th attenuation control signals, to thereby generate an attenuated input signal, n being an integer larger than 2;
    a signal amplifier configured to amplify the attenuated input signal;
    a detector circuit configured to perform an envelop detection on the amplified attenuated input signal, to thereby obtain an amplitude value;
    a comparator circuit configured to compare the amplitude value with a reference threshold value, to thereby generate a comparison result signal indicating a result of the comparison; and
    an attenuator control circuit configured to generate the first to n-th attenuation control signals using the comparison result signal, and to supply the first to n-th attenuation control signals to the attenuator, wherein the first to n-th attenuation control signals indicate first to n-th attenuation amounts by which the first to n-th attenuator parts respectively attenuate the input signal, and first to n-th time periods during which the first to n-th attenuator parts respectively operate, the first attenuation control signal is generated by delaying the comparison result signal by a delay time that is n-times of the prescribed time interval, the second attenuation control signal is generated by performing a logical AND on
- a first signal obtained by delaying the comparison result signal by a delay time that is (n+1) times of the prescribed time interval, and
- a second signal obtained by delaying the comparison result signal by a delay time that is (n−1) times of the prescribed time interval, and the k-th attenuation control signal, wherein 3≤k≤n, is generated by performing a logical AND on
- a third signal obtained by delaying the (k−1)th attenuation control signal by a delay time that is equal to the prescribed time interval, and
- a fourth signal obtained by delaying the comparison result signal by a delay time that is (n−k+1) times of the prescribed time interval.

3. The gain control circuit according to claim 2, wherein the attenuator control circuit includes a plurality of delay circuits and a plurality of logic circuits.

4. The gain control circuit according to claim 3, wherein each of the plurality of delay circuits includes a D-type flip-flop circuit that receives a clock signal to operate.

5. The gain control circuit according to claim 4, wherein the comparator circuit supplies, to the attenuator control circuit, a clock stop signal that stops a supply of the clock signal to the plurality of delay circuits in accordance with the result of the comparison.

6. A gain control method for performing gain control on an input signal, comprising:
performing, by an attenuator, first to n-th attenuation on the input signal in accordance with first to n-th attenuation control signals, to thereby generate an attenuated input signal, n being an integer larger than 2;
amplifying, by a signal amplifier, the attenuated input signal;
performing, by a detector circuit, an envelope detection on the amplified attenuated input signal, to thereby obtain an amplitude value;
comparing, by a comparator circuit, the amplitude value with a reference threshold value, to thereby generate a comparison result signal indicating a result of the comparison; and
generating, by an attenuator control circuit, the first to n-th attenuation control signals using the comparison result signal, and supplying the first to n-th attenuation control signals to the first to n-th attenuator parts, respectively, wherein
each of the first to n-th attenuator parts attenuates the input signal at a respective timing and for a respective time period, based on a duration in which the amplitude value is greater than the reference threshold value as determined by the comparator circuit, the respective time period being set to N-times of a prescribed time interval by a corresponding one of the first to n-th attenuation control signals, N being an integer larger than 2.

7. The gain control method according to claim 6, wherein the generating the first to n-th attenuation control signals includes:
generating by delaying the comparison result signal by a delay time that is n-times of the prescribed time interval;
generating the second attenuation control signal by performing a logical AND on
- a first signal obtained by delaying the comparison result signal by a delay time that is (n+1) times of the prescribed time interval, and
- a second signal obtained by delaying the comparison result signal by a delay time that is (n−1) times of the prescribed time interval; and generating the k-th attenuation control signal, wherein 3≤k≤n, by performing a logical AND on
- a third signal obtained by delaying the (k−1)th attenuation control signal by a delay time that is equal to the prescribed time interval, and
- a fourth signal obtained by delaying the comparison result signal by a delay time that is (n−k+1) times of the prescribed time interval.

8. The gain control method according to claim 7, wherein the generating the first to n-th attenuation control signals further includes
generating each of the first attenuation control signal and the first to fourth signals in accordance with a supply of a clock signal, and
stopping the supply of the clock signal based on the result of the comparison.

* * * * *